(12) United States Patent
Pan

(10) Patent No.: US 12,002,434 B2
(45) Date of Patent: Jun. 4, 2024

(54) GATE DRIVER ON ARRAY CIRCUIT AND DISPLAY PANEL

(71) Applicant: WUHAN CHINA STAR OPTOELECTRONICS TECHNOLOGY CO., LTD., Wuhan (CN)

(72) Inventor: You Pan, Wuhan (CN)

(*) Notice: Subject to any disclaimer, the term of this patent is extended or adjusted under 35 U.S.C. 154(b) by 0 days.

(21) Appl. No.: 17/599,639

(22) PCT Filed: Aug. 18, 2021

(86) PCT No.: PCT/CN2021/113145
§ 371 (c)(1),
(2) Date: Sep. 29, 2021

(87) PCT Pub. No.: WO2023/010614
PCT Pub. Date: Feb. 9, 2023

(65) Prior Publication Data
US 2024/0029683 A1  Jan. 25, 2024

(30) Foreign Application Priority Data
Mar. 8, 2021 (CN) .......................... 202110884505

(51) Int. Cl.
*G09G 3/36* (2006.01)

(52) U.S. Cl.
CPC ... *G09G 3/3677* (2013.01); *G09G 2300/0408* (2013.01); *G09G 2300/0426* (2013.01); *G09G 2300/0852* (2013.01)

(58) Field of Classification Search
None
See application file for complete search history.

(56) References Cited

U.S. PATENT DOCUMENTS

| | | | |
|---|---|---|---|
| 5,903,249 A | 5/1999 | Koyama et al. | |
| 2011/0221736 A1 | 9/2011 | Pak et al. | |
| 2016/0189648 A1 | 6/2016 | Xiao | |
| 2020/0226993 A1* | 7/2020 | Zhang | G09G 3/3677 |
| 2021/0225311 A1* | 7/2021 | Zhang | G11C 19/28 |

FOREIGN PATENT DOCUMENTS

| | | |
|---|---|---|
| CN | 103474038 A | 12/2013 |
| CN | 103578414 A | 2/2014 |
| CN | 103943063 A | 7/2014 |
| CN | 105427793 A | 3/2016 |
| CN | 105469766 A | 4/2016 |
| CN | 105609072 A | 5/2016 |
| CN | 107068074 A | 8/2017 |

(Continued)

*Primary Examiner* — Ifedayo B Iluyomade

(57) ABSTRACT

The present embodiment provides a GOA circuit and a display panel, in which the GOA circuit comprises a forward/backward scanning control module, an output module, a potential regulation module, a node control module, and a voltage stabilizer module. A first node and a third node are not conducted when a second node is at a second potential; the first node and the third node are conducted and have a second potential when the second node is at a third potential, wherein the second potential is opposite to the third potential. Thus, GOA circuit's leakage issue existing in the TP suspension stage can be improved.

20 Claims, 3 Drawing Sheets

(56) References Cited

FOREIGN PATENT DOCUMENTS

| CN | 108010498 | A | 5/2018 | | |
|---|---|---|---|---|---|
| CN | 108091308 | A | 5/2018 | | |
| CN | 110688024 | A | 1/2020 | | |
| CN | 112102768 | * | 12/2020 | ............... | G09G 3/20 |
| CN | 112102768 | A | 12/2020 | | |
| KR | 20070000832 | A | 1/2007 | | |

\* cited by examiner

GATE DRIVER ON ARRAY CIRCUIT AND DISPLAY PANEL

FIELD OF INVENTION

The present application relates the field of display technology, and particularly to a pixel driving circuit and a liquid crystal display panel.

BACKGROUND OF INVENTION

Gate Driver On Array, referred to as "GOA", is a technology that fabricates the scan driving signal circuit of the gate lines on the array substrate by using the existing thin-film transistor liquid crystal display array process, so as to realize the driving method of the sequential scanning. Touch panel (TP) suspension refers to a function that the GOA circuit having ITP (i.e., In Cell Touch Panel) function suspends the scanning during display period.

In the related art of the GOA circuit, there is a leakage issue during the TP suspension stage.

SUMMARY OF INVENTION

The present embodiment provides a GOA circuit and a display panel capable of improving the leakage issue of the GOA circuit during the TP suspension stage.

The present embodiment provides a GOA circuit, comprising a plurality of GOA units connected in cascade, wherein N is a positive integer and a Nth GOA unit, except for the first, the second, the second to last, and the last GOA units, comprises:

a forward/backward scanning control module, receiving a forward scan signal and a backward scan signal, electrically connected to an output terminal of the (N−2)th GOA unit, an output terminal of the (N+2)th GOA unit, and a first node, and configured to regulate the potential at the first node to a first potential according to the potential at the output terminal of the (N−2)th GOA unit, the potential at the output terminal of the (N+2) the GOA unit, the forward scan signal, and the backward scan signal;

an output module, comprising a ninth thin-film transistor, wherein the ninth thin-film transistor has a gate electrode electrically connected to a third node, a source electrode electrically receiving a Nth clock signal, and a drain electrode electrically connected to an output terminal;

a potential regulation module, receiving a (N+2)th clock signal, a (N−2)th clock signal, the forward scan signal, the backward scan signal, a constant high voltage potential, and a constant low voltage potential, electrically connected to the first node and the output terminal, and configured to regulate the potential at the first node to a constant voltage potential based on the control of the (N+2)th clock signal, the (N−2)th clock signal, the forward scan signal, and the backward scan signal;

a node control module, receiving the constant voltage potential and electrically connected to the first node and a second node;

a voltage stabilizer module, receiving the signals from the first node, the third node, and the second node and configured to prevent the first node and the third node from conduction when the second node is at a second potential and to conduct the first node and the third node to become the second potential when the second node is at a third potential, wherein the second potential is opposite to the third potential.

The present embodiment further provides a GOA circuit, comprising a plurality of GOA units connected in cascade, wherein N is a positive integer and a Nth GOA unit, except for the first, the second, the second to last, and the last GOA units, comprises:

a ninth thin-film transistor, having a gate electrode electrically connected to a third node, a source electrode electrically receiving a Nth clock signal, and a drain electrode electrically connected to an output terminal;

a seventh thin-film transistor, having a source electrode electrically connected to a first node, a gate electrode connected to the first node, and a drain electrode connected to the third node;

an eleventh thin-film transistor, having a source electrode electrically connected to the third node, a gate electrode connected to a second node, and a drain electrode connected to the first node;

when the GOA circuit enters a suspended period during display, the seventh thin-film transistor and the eleventh thin-film transistor are turned off, the potential at the first node decreases, and the third node remains at the original high potential.

The present embodiment further provides a display panel, comprising any one of the above-mentioned GOA circuits.

Beneficial Effects

The GOA circuit of the present embodiment comprises a plurality of GOA units connected in cascade, wherein N is a positive integer and a Nth GOA unit, except for the first, the second, the second to last, and the last GOA units, comprises a forward/backward scanning control module, an output module, a potential regulation module, a node control module, and a voltage stabilizer module. The voltage stabilizer module receives the signals from the first node, the third node, and the second node and is configured to prevent the first node and the third node from conduction when the second node is at a second potential and to conduct the first node and the third node to become the second potential when the second node is at a third potential, wherein the second potential is opposite to the third potential. The first node, the second node, and the third node can normally output during the suspension stage by disposing the voltage stabilizer module having the voltage stabilization function, and thus GOA circuit's leakage issue existing in the TP suspension stage can be improved.

DESCRIPTION OF DRAWINGS

In order to explain more clearly the technical solution in the present embodiment, the following is a brief introduction of the drawings described in the embodiments. Obviously, the drawings described below are only some embodiments of the present application. For the person having ordinary skill in the art, other drawings can be obtained from these drawings without any creative effort.

DETAILED DESCRIPTION OF EMBODIMENTS

Gate Driver On Array, referred to as "GOA", is a technology that fabricates the scan driving signal circuit of the gate lines on the array substrate by using the existing thin-film transistor liquid crystal display array process, so as to realize the driving method of the sequential scanning. TP suspension refers to a function that the GOA circuit having ITP function suspends the scanning during display period. In the traditional in-cell touch screen technology, the GOA circuit suspends the display scanning after a plurality of rows of pixels in the active area have been scanned, and then starts to proceed the touch scanning to scan the touch electrodes in the active area. The display scanning will be proceeded, again, after finishing the touch scanning. The two scanning processes will be alternatively and continuously proceeded several times, in which the proceeding times depend on the specific products, and thus the display of one frame and the scanning of the touch electrodes in the full screen can be completed. However, in the related art of the GOA circuit, there is a leakage issue when the TP is suspended.

Figure 1:
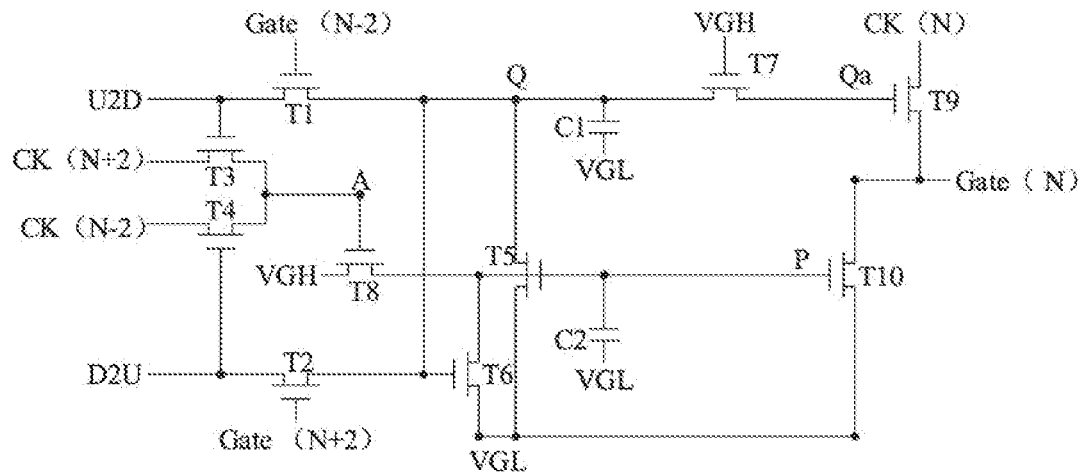
FIG. 1 is a structural schematic diagram of a GOA circuit in the prior art.

For example, refer to FIG. 1, which is a structural schematic diagram of a GOA circuit in the prior art. When the existing GOA circuit operates in a non-suspension stage, the scan signal of the output terminal Gate(N−2) of the (N−2)th GOA unit is at the high potential, so that the first thin-film transistor T1 is turned on to cause the potential at the first node Q(N) and the third node Qa(N) convert into the high potential, which turns on the ninth thin-film transistor T9. The output terminal Gate(N) electrically connects to the Nth clock signal CK(N) when the ninth thin-film transistor T9 is turned on, so that the output terminal Gate(N) outputs the scan signal with the high potential when the Nth clock signal CK(N) is at the high potential so as to enable the gate corresponding to the current stage. When the (N+2)th clock signal CK(N+2) is the high potential, the fourth node A is at the high potential, so that the eighth thin-film transistor T8 is turned on to cause the second node P(N) at the high potential, which turns on the fifth thin-film transistor T5. The first node Q(N) and the third node Qa(N) convert into the low potential to turn off the ninth thin-film transistor T9. At the same time, the tenth thin-film transistor T10 is turned on, so that the output terminal Gate(N) electrically connects to VGL and ends the transmission of the current stage. When the GOA circuit enters the TP suspension stage after the output terminal Gate(N−2) outputs the scan signal, the scan signal of the output terminal Gate(N−2) is enabled, similar to above, for a pulse period of the clock signal, so that the first node Q(N) and the third node Qa(N) connect to the forward scan signal and convert into the high potential. After the output terminal Gate(N−2) is disabled, the first node Q(N) and the third node Qa(N) remain at the high potential until the end of the TP suspension stage, and the Nth clock signal CK(N) is enabled to make the output terminal Gate (N) outputs the scan signal. The clock signal CK(N+2) is enabled to make the second node P(N) at the high potential, so that the fifth thin-film transistor T5 is turned on and the first node Q(N) and the third node Qa(N) connect to VGL. The ninth thin-film transistor T9 is turned off and the tenth thin-film transistor T10 is turned on at the same time, so that the output terminal Gate(N) outputs the scan signal with the low potential and ends the transmission of the current stage.

Double 85 test refers to operate the display panel under 85 degree Celsius and 85% humidity, which is a common reliability life test method for panels. When proceeding double 85 test, the fifth thin-film transistor T5 is in a serious positive voltage bias and temperature stress (PBTS) state for a long time. Because Vgs equals to VGH minus VGL (Vgs=VGH−VGL), the negative offset of Vth may occur or Ioff may increase when the fifth thin-film transistor T5 is under a long-term operation. This refers to the Vgs–Ids curve of thin-film transistor TFT, Vth refers to the threshold voltage, and Ioff refers to the off-state current. Since the thin-film transistor TFT devices operate in the bias and temperature stress (BTS) state for a long time, the characteristics of the thin-film transistor TFT devices deteriorate, and the common failure mechanisms are the negative offset of Vth and increasing Ioff. When entering the TP suspension stage, the potential at the first node Q(N) should be maintained at VGH, and the potential at the second node P(N) should be maintained at VGL. In the meantime, Vgs of the fifth thin-film transistor T5 is zero (Vgs=0). However, if the fifth thin-film transistor T5 is affected by stress resulting Ioff higher than 10E-8A when Vgs=0V, the first node Q(N) has a leakage path of the fifth thin-film transistor T5, so that VGH level at the first node Q(N) is pulled down. Since the third node Qa(N) connects to the first node Q(N), VGH level at the third node Qa(N) is also pulled down, so that the ninth thin-film transistor T9 cannot be completely turned on and thus the output terminal Gate(N) outputs the scan signal with insufficient level. Due to the insufficient level of the scan signal from the output terminal Gate(N), the first thin-film transistor T1 in the next stage cannot be completely turned on and the potential at the node Q(N+2) cannot be increased to the high potential. The ninth thin-film transistor T9 in the next stage cannot be normally turned on and resulting the transmission failure of the GOA circuit during the TP suspension period. That is, there is a leakage issue in the TP suspension stage.

To solve the above problems, the present embodiment provides a GOA circuit and a display panel. The GOA circuit and the display panel will be explained below in combination with the drawings.

The present embodiment provides a GOA circuit, comprising a plurality of GOA units connected in cascade, wherein N is a positive integer and a Nth GOA unit, except for the first, the second, the second to last, and the last GOA units, comprises:

a forward/backward scanning control module, receiving a forward scan signal and a backward scan signal, electrically connected to an output terminal of the (N−2)th GOA unit, an output terminal of the (N+2)th GOA unit, and a first node, and configured to regulate the potential at the first node to a first potential according to the potential at the output terminal of the (N−2)th GOA unit, the potential at the output terminal of the (N+2)th GOA unit, the forward scan signal, and the backward scan signal, an output module, comprising a ninth thin-film transistor, wherein the ninth thin-film transistor has a gate electrode electrically connected to a third node, a source electrode electrically receiving a Nth clock signal, and a drain electrode electrically connected to an output terminal;

a potential regulation module, receiving a (N+2)th clock signal, a (N−2)th clock signal, the forward scan signal, the backward scan signal, a constant high voltage potential, and a constant low voltage potential, electrically connected to the first node and the output terminal, and configured to regulate the potential at the first node to a constant voltage potential based on the control of the (N+2)th clock signal, the (N−2)th clock signal, the forward scan signal, and the backward scan signal;

a node control module, receiving the constant voltage potential and electrically connected to the first node and a second node;

a voltage stabilizer module, receiving the signals from the first node, the third node, and the second node and configured to prevent the first node and the third node from conduction when the second node is at a second potential and to conduct the first node and the third node to become the second potential when the second node is at a third potential, wherein the second potential is opposite to the third potential.

The first node, the second node, and the third node can normally output during the suspension stage by disposing the voltage stabilizer module having the voltage stabilization function to disconnect the first node and the third node when the second node is at the second potential and to connect the first node and the third node to become the second potential when the second node is at the third potential, the leakage issue of the GOA circuit existing in the TP suspension stage can be improved.

Figure 2:
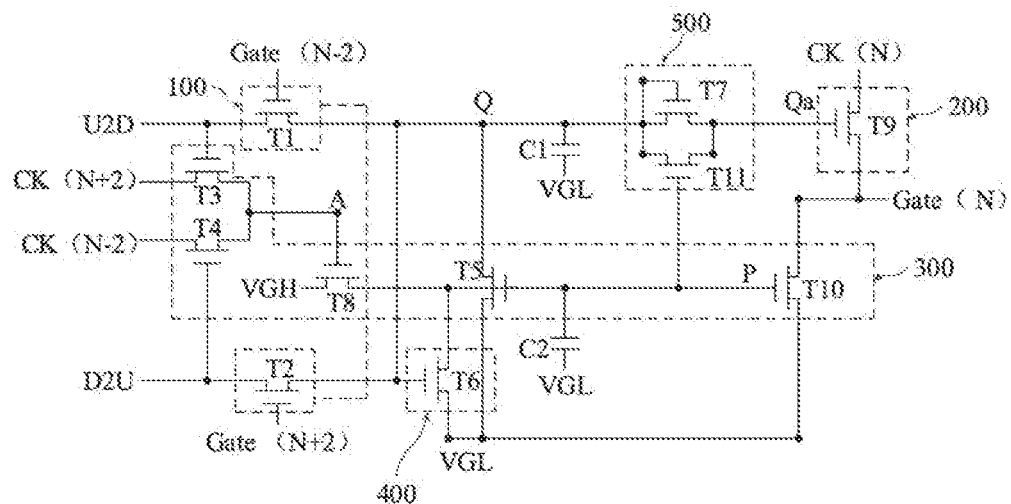
FIG. 2 is a structural schematic diagram of a GOA circuit in a first embodiment of the present application.

For example, refer to FIG. 2, which is a structural schematic diagram of a GOA circuit in a first embodiment of the present application. The present embodiment provides a GOA circuit, comprising a plurality of GOA units connected in cascade. Except for the first, the second, the second to last, and the last GOA units, the Nth GOA unit, where N is a positive integer, comprises a forward/backward scanning control module 100, an output module 200, a potential regulation module 300, a node control module 400, and a voltage stabilizer module 500.

The forward/backward scanning control module 100 receives a forward scan signal U2D and a backward scan signal D2U, and is electrically connected to an output terminal Gate(N−2) of the (N−2)th GOA unit, an output terminal Gate(N+2) of the (N+2)th GOA unit, and a first node Q(N). The forward/backward scanning control module 100 is configured to pull up the potential at the first node Q(N) according to the potential at the output terminal Gate(N−2) of the (N−2)th GOA unit, the potential at the output terminal Gate(N+2) of the (N+2)th GOA unit, the forward scan signal U2D, and the backward scan signal D2U.

The output module 200 comprises a ninth thin-film transistor T9; the ninth thin-film transistor T9 has a gate electrode electrically connected to a third node Qa(N), a source electrode electrically receiving a Nth clock signal CK(N), and a drain electrode electrically connected to an output terminal Gate(N).

The potential regulation module 300 receives a (N+2)th clock signal CK(N+2), a (N−2)th clock signal CK(N−2), the forward scan signal U2D, the backward scan signal D2U, a constant high voltage potential VGH, and a constant low voltage potential VGL, and is electrically connected to the first node Q(N) and the output terminal Gate(N). The potential regulation module 300 is configured to pull the potential at the first node Q(N) to the constant low voltage potential VGL based on the control of the (N+2)th clock signal CK(N+2), the (N−2)th clock signal CK(N−2), the forward scan signal U2D, and the backward scan signal D2U. Herein, the potential regulation module 300 can be regarded as a pull-down module.

The node control module 400 receives the constant low voltage potential VGL and is electrically connected to the first node Q(N) and the second node P(N).

The voltage stabilizer module 500 receives the signals from the first node Q(N), the third node Qa(N), and the second node P(N) and is configured to prevent the first node Q(N) and the third node Qa(N) from conduction when the second node P(N) is at the low potential and to conduct the first node Q(N) and the third node Qa(N) to become the low potential when the second node P(N) is at the high potential.

The first node Q(N), the second node P(N), and the third node Qa(N) can normally output during the suspension stage by disposing the voltage stabilizer module 500 having the voltage stabilization function to disconnect the first node Q(N) and the third node Qa(N) when the second node P(N) is at the low potential and to connect the first node Q(N) and the third node Qa(N) to become the low potential when the second node P(N) is at the high potential, the leakage issue of the GOA circuit existing in the TP suspension stage can be improved.

In order to more clearly explain the GOA circuit of the present embodiment, each module comprised in the GOA circuit will be introduced below.

For example, refer to FIG. 2 again, the forward/backward scan control module 100 comprises a first thin-film transistor T1 and a second thin-film transistor T2. The first thin-film transistor T1 has a gate electrode electrically connected to the output terminal Gate(N−2) of the (N−2)th GOA unit, a source electrode receiving the forward scan signal U2D, and a drain electrode electrically connected to the first node Q(N). The second thin-film transistor T2 has a gate electrode electrically connected to the output terminal Gate(N+2) of the (N+2)th GOA unit, a source electrode receiving the backward scan signal D2U, and a drain electrode electrically connected to the first node Q(N).

The potential regulation module 300 comprises a third thin-film transistor T3, a fourth thin-film transistor T4, an eighth thin-film transistor T8, a fifth thin-film transistor T5, and a tenth thin-film transistor T10. The third thin-film transistor T3 has a gate electrode receiving the forward scan signal U2D, a source electrode receiving the (N+2)th clock signal CK(N+2), and a drain electrode electrically connected to a drain electrode of the fourth thin-film transistor T4. The fourth thin-film transistor T4 has a gate electrode receiving the backward scan signal D2U and a source electrode receiving the (N−2)th clock signal CK(N−2). The eighth thin-film transistor T8 has a gate electrode electrically connected to the drain electrode of the third thin-film transistor T3, a source electrode receiving the constant high voltage potential VGH, a drain electrode electrically connected to the second node P(N). The fifth thin-film transistor T5 has a gate electrode electrically connected to the second node P(N), a source electrode electrically connected to the first node Q(N), and a drain electrode receiving the constant low voltage potential VGL. The tenth thin-film transistor T10 has a gate electrode electrically connected to the second node P(N), a source electrode electrically connected to the output terminal Gate(N), and a drain electrode receiving the constant low voltage potential VGL.

The node control module 400 comprises a sixth thin-film transistor T6. The sixth thin-film transistor T6 has a gate electrode electrically connected to the first node Q(N), a source electrode electrically connected to the second node P(N), and a drain electrode receiving the constant low voltage potential VGL.

The voltage stabilizer module 500 comprises a seventh thin-film transistor T7 and an eleventh thin-film transistor T11. The seventh thin-film transistor T7 has a source electrode electrically connected to the first node Q(N), a gate electrode connected to the first node Q(N), and a drain electrode connected to the third node Qa(N). The eleventh thin-film transistor T11 has a source electrode electrically connected to the third node Qa(N), a gate electrode connected to the second node P(N), and a drain electrode connected to the first node Q(N). The seventh thin-film transistor T7 and the eleventh thin-film transistor T11 are turned off when the GOA circuit enters a scanning suspended stage (i.e., TP suspension stage) during a display period, and the third node Qa(N) remains at the original high potential when the potential at the first node Q(N) decreases. During the first thin-film transistor is turned on, the third node and the forward scan signal are connected to each other and at the high potential when the potential at the first node decreases. During the turn-on period of the first thin-film transistor T1, the third node Qa(N) and the forward scan signal U2D are connected to each other and at the high potential when the potential at the first node Q(N) decreases.

The GOA circuit further comprises a first capacitor C1 and/or a second capacitor C2. The first capacitor C1 has one end receiving the constant low voltage potential VGL and the other end electrically connected to the first node Q(N). The second capacitor C2 has one end electrically connected to the second node P(N) and the other end receiving the constant low voltage potential VGL.

It should be noted that, with respect to the first, the second, the second to last, and the last GOA units, the circuit configuration of the above four GOA units are the same as the Nth GOA unit mentioned above. The difference between the above four GOA units and the Nth GOA unit is that: the gate electrodes of the first thin-film transistors T1 in the first GOA unit and the second GOA unit receive a circuit start signal STV, and the rest are the same as the other stage of the GOA units. The gate electrodes of the second thin-film transistor T2 in the second to last GOA unit and the last GOA unit receive the circuit start signal STV, and the rest are the same as the other stage of the GOA units.

It should be noted that, since the common GOA circuit does not have the eleventh thin-film transistor T11 configured to proceed the voltage stabilization function, there is a leakage path existing in the common GOA circuit during the TP suspension stage.

Figure 3:
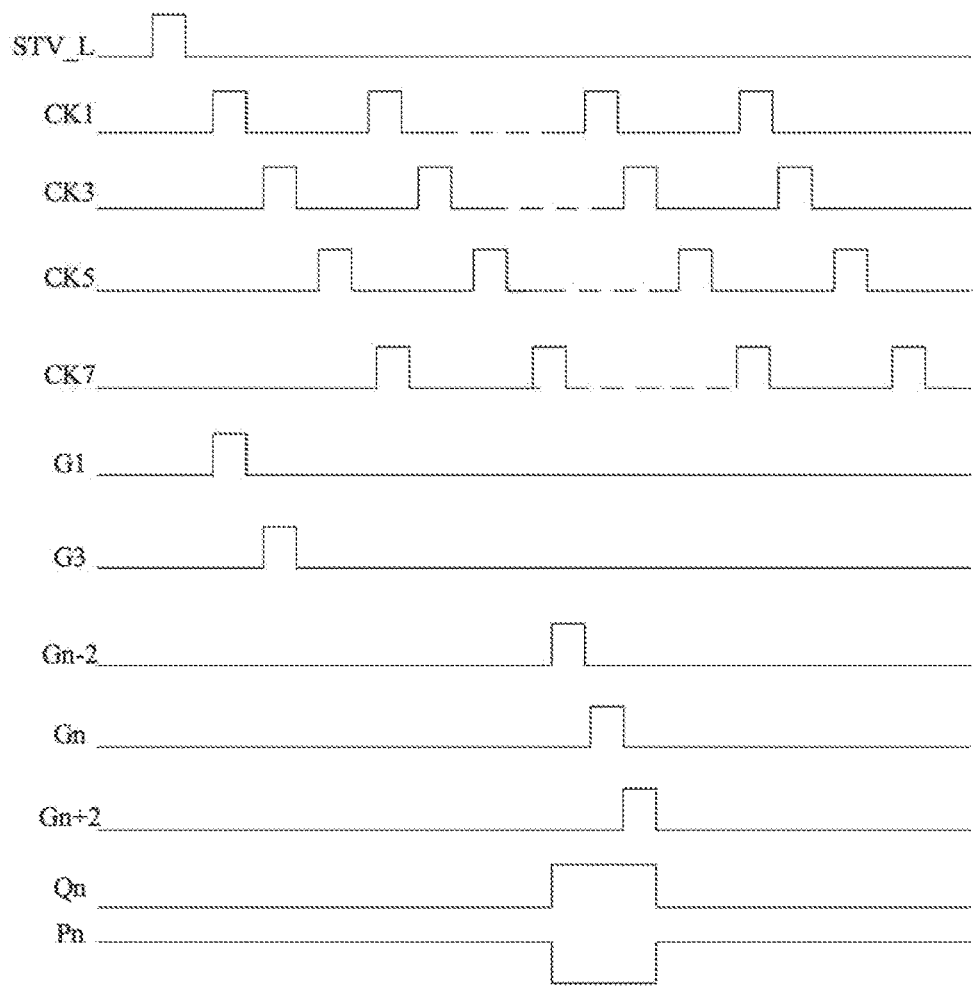
FIG. 3 is a sequence diagram of the GOA circuit shown in FIG. 2.

To solve the above problems, the GOA circuit of the present embodiment can prevent the double 85 test from failure. For example, refer to FIG. 2 and FIG. 3 together, in which FIG. 3 is a sequence diagram of the GOA circuit shown in FIG. 2. When the GOA circuit operates in the non-suspension stage, the scan signal of the output terminal Gate(N−2) of the (N−2)th GOA unit is at the high potential, so that the first thin-film transistor T1 is turned on to cause the potential at the first node Q(N) and the third node Qa(N) convert into the high potential, which turns on the ninth thin-film transistor T9. The output terminal Gate(N) electrically connects to the Nth clock signal CK(N) when the ninth thin-film transistor T9 is turned on, so that the output terminal Gate(N) outputs the scan signal with the high potential when the Nth clock signal CK(N) is at the high potential so as to enable the gate corresponding to the current stage. When the (N+2)th clock signal CK(N+2) is the high potential, the fourth node A(N) is at the high potential, so that the eighth thin-film transistor T8 is turned on to cause the second node P(N) at the high potential, which turns on the fifth thin-film transistor T5 and converts the potential at the first node Q(N) into the low potential. The eleventh thin-film transistor T11 is turned on to connect the third node Qa(N) and the first node Q(N) to convert the potential at the third node Qa(N) into the low potential. The ninth thin-film transistor T9 is turned off and the tenth thin-film transistor T10 is turned on at the same time, so that the output terminal Gate(N) electrically connects to VGL and ends the transmission of the current stage. When the GOA circuit enters the TP suspension stage after the output terminal Gate(N−2) outputs the scan signal, the scan signal of the output terminal Gate(N−2) is enabled, similar to above, for a pulse period of the clock signal, so that the first node Q(N) and the third node Qa(N) connect to the forward scan signal U2D and convert into the high potential. After the output terminal Gate(N−2) is disabled, the first node Q(N) and the third node Qa(N) remain at the high potential until the end of the TP suspension stage, and the Nth clock signal CK(N) is enabled to make the output terminal Gate(N) outputs the scan signal. The clock signal CK(N+2) is enabled to make the second node P(N) at the high potential, so that the fifth thin-film transistor T5 is turned on and the first node Q(N) and the third node Qa(N) connect to VGL. The ninth thin-film transistor T9 is turned off and the tenth thin-film transistor T10 is turned on at the same time, so that the output terminal Gate(N) outputs the scan signal with the low potential and ends the transmission of the current stage.

It should be noted that, in the GOA circuit of the present embodiment, the seventh thin-film transistor T7 is rewired to connect the gate electrode to the first node Q(N). The eleventh thin-film transistor is further added to have the gate electrode connects to the second node P(N), the drain electrode connects to the third node Qa(N), and the source electrode connects to the first node Q(N). In the long-term operation, the negative offset of Vth or increasing Ioff may occur in the fifth thin-film transistor T5. When entering the TP suspension period, the leakage of the fifth thin-film transistor T5 results the potential at the first node Q(N) decreases while the third node Qa(N) remains at the high potential. However, since the seventh thin-film transistor T7 and the eleventh thin-film transistor T11 are turned off, the potential at the third node Qa(N) does not decrease, so that the turn-on state of the ninth thin-film transistor T9 will not be affected, and the GOA circuit can output normally. After the output terminal Gate(N) output the scan signal, the clock signal CK(N+2) is at the high potential and the first node Q(N) is pulled down to the low potential by the fifth thin-film transistor T5 and the second thin-film transistor T2. At the same time, the eleventh thin-film transistor T1 is turned on to connect the third node Qa(N) and the first node Q(N), and the ninth thin-film transistor T9 is turned off.

Figure 4:
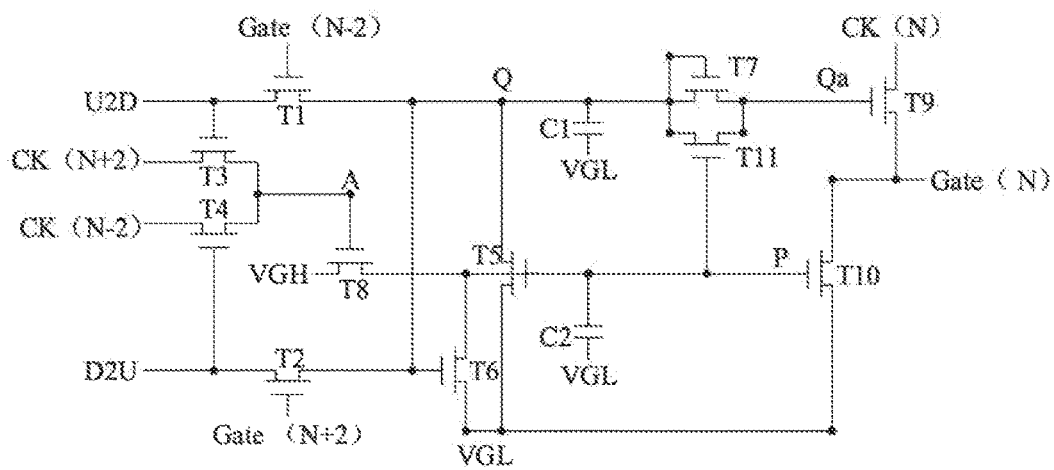
FIG. 4 is a structural schematic diagram of a GOA circuit in a second embodiment of the present application.

The present embodiment further provides a GOA circuit as shown in FIG. 4. is a structural schematic diagram of a GOA circuit in a second embodiment of the present application. The GOA circuit comprises a plurality of GOA units connected in cascade. Except for the first, the second, the second to last, and the last GOA units, the Nth GOA unit, where N is a positive integer, comprises a ninth thin-film transistor T9, a seventh thin-film transistor T7, and an eleventh thin-film transistor T11. The ninth thin-film transistor T9 has a gate electrode electrically connected to the third node Qa(N), a source electrode electrically receiving a Nth clock signal, and a drain electrode electrically connected to the output terminal Gate(N). The seventh thin-film transistor T7 has a source electrode electrically connected to the first node Q(N), a gate electrode connected to the first node Q(N), and a drain electrode connected to the third node Qa(N). The eleventh thin-film transistor T11 has a source electrode electrically connected to the third node Qa(N), a gate electrode connected to a second node P(N), and a drain electrode connected to the first node Q(N). When the GOA circuit enters a scanning suspended stage (i.e., TP suspension stage) during display, the seventh thin-film transistor T7 and the eleventh thin-film transistor T11 are turned off, the potential Q(N) at the first node decreases, and the third node Qa(N) remains at the original high potential.

The GOA circuit further comprises a first thin-film transistor T1 and a second thin-film transistor T2. The first thin-film transistor has a gate electrode electrically connected to the output terminal Gate(N−2) of the (N−2)th GOA unit, a source electrode receiving the forward scan signal U2D, and a drain electrode electrically connected to the first node Q(N). The second thin-film transistor T2 has a gate electrode electrically connected to the output terminal Gate(N+2) of the (N+2)th GOA unit, a source electrode receiving the backward scan signal D2U, and a drain electrode electrically connected to the first node Q(N). During the turn-on period of the first thin-film transistor T1, the third node Qa(N) and the forward scan signal U2D are connected to each other and at the high potential when the potential at the first node Q(N) decreases.

The GOA circuit further comprises a third thin-film transistor T3, a fourth thin-film transistor T4, an eighth thin-film transistor T8, a fifth thin-film transistor T5, and a tenth thin-film transistor T10. The third thin-film transistor T3 has a gate electrode receiving the forward scan signal U2D and a source electrode receiving the (N+2)th clock signal CK(N+2). The fourth thin-film transistor T4 has a gate electrode receiving the backward scan signal D2U, a source electrode receiving the (N−2)th clock signal CK(N+2), and a drain electrode electrically connected to a drain electrode of the third thin-film transistor T3. The eighth thin-film transistor T8 has a gate electrode electrically connected to the drain electrode of the third thin-film transistor T3, a source electrode receiving the constant high voltage potential VGH, a drain electrode electrically connected to the second node P(N). The fifth thin-film transistor T5 has a gate electrode electrically connected to the second node P(N), a source electrode electrically connected to the first node Q(N), and a drain electrode receiving the constant low voltage potential VGL. The tenth thin-film transistor T10 has a gate electrode electrically connected to the second node P(N), a source electrode electrically connected to the output terminal Gate(N), and a drain electrode receiving the constant low voltage potential VGL.

The GOA circuit further comprises a sixth transistor T6. The sixth transistor T6 has a gate electrode electrically connected to the first node Q(N), a source electrode electrically connected to the second node P(N), and a drain electrode receiving the constant low voltage potential VGL.

The GOA circuit further comprises a first capacitor C1 and/or a second capacitor C2. The first capacitor C1 has one end receiving the constant low voltage potential VGL and the other end electrically connected to the first node Q(N). The second capacitor C2 has one end electrically connected to the second node P(N) and the other end electrically connected to the constant low voltage potential VGL.

It should be noted that, the other part of the GOA circuit provided by the present embodiment can be referred to the embodiments shown in FIG. 2 and FIG. 3 as well as the above description, which will not be repeated herein.

It should be noted that, the thin-film transistor in the aforementioned GOA circuit can be implemented by N-Metal-Oxide-Semiconductor (NMOS). The thin-film transistors (or the MOS transistors) are divided into two kinds, N channel and P channel, and thus the MOS transistors can be divided into P-type MOS transistors and N-type MOS transistors. Therefore, the thin-film transistor can also be implemented by P-Metal-Oxide-Semiconductor (PMOS).

Figure 5:
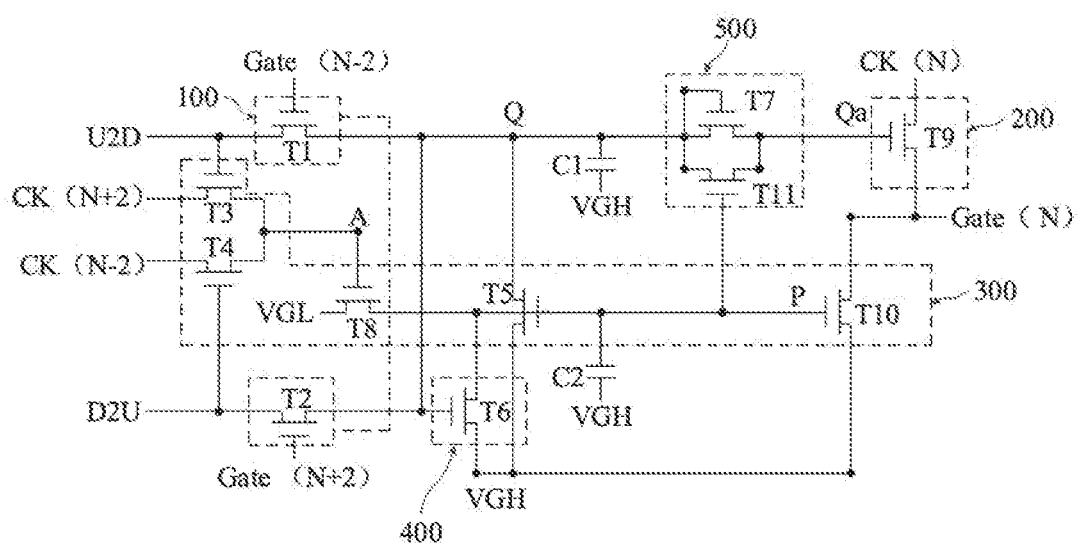
FIG. 5 is a structural schematic diagram of a GOA circuit in a third embodiment of the present application.

For example, refer to FIG. 5, which is a structural schematic diagram of a GOA circuit in a third embodiment of the present application. The present embodiment further provides a GOA circuit, comprising a plurality of GOA units connected in cascade. Except for the first, the second, the second to last, and the last GOA units, the Nth GOA unit, where N is a positive integer, comprises:

a forward/backward scanning control module 100, receiving a forward scan signal U2D and a backward scan signal D2U and electrically connected to an output terminal Gate(N−2) of the (N−2)th GOA unit, an output terminal Gate(N+2) of the (N+2)th GOA unit, and a first node Q(N). The forward/backward scanning control module 100 is configured to pull down the potential at the first node Q(N) according to the potential at the output terminal Gate(N−2) of the (N−2)th GOA unit, the potential at the output terminal Gate(N+2) of the (N+2) the GOA unit, the forward scan signal U2D, and the backward scan signal D2U.

An output module 200 comprises a ninth thin-film transistor T9. The ninth thin-film transistor T9 has a gate electrode electrically connected to a third node Qa(N), a source electrode electrically receiving a Nth clock signal CK(N), and a drain electrode electrically connected to an output terminal Gate(N).

A potential regulation module 300 receives a (N+2)th clock signal CK(N+2), a (N−2)th clock signal CK(N−2), the forward scan signal U2D, the backward scan signal D2U, a constant high voltage potential VGH, and a constant low voltage potential VGL, and is electrically connected to the first node Q(N) and the output terminal Gate(N). The potential regulation module 300 is configured to pull the potential at the first node Q(N) up to the constant high voltage potential VGH based on the control of the (N+2)th clock signal CK(N+2), the (N−2)th clock signal CK(N−2), the forward scan signal U2D, and the backward scan signal D2U. Herein, the potential regulation module 300 can be regarded as a pull-up module.

A node control module 400 receives the constant high voltage potential VGH and is electrically connected to the first node Q(N) and the second node P(N).

A voltage stabilizer module 500 receives the signals from the first node Q(N), the third node Qa(N), and the second node P(N) and is configured to prevent the first node Q(N) and the third node Qa(N) from conduction when the second node P(N) is at the high potential and to conduct the first node Q(N) and the third node Qa(N) to become the high potential when the second node P(N) is at the low potential.

The description for each module of the present embodiment can be referred to the embodiments shown in FIG. 2 and FIG. 3 as well as the above description. The difference is that the NMOS transistors are turned on when the gate electrode receives a signal with the high potential, and the PMOS transistors are turned on when the gate electrode receives a signal with the low potential, and thus it will not be repeated herein.

The first node Q(N), the second node P(N), and the third node Qa(N) can normally output during the suspension stage by disposing the voltage stabilizer module 500 having the voltage stabilization function to disconnect the first node Q(N) and the third node Qa(N) when the second node P(N) is at the high potential and to connect the first node Q(N) and the third node Qa(N) to become the high potential when the second node P(N) is at the low potential, the leakage issue of the GOA circuit existing in the TP suspension stage can be improved.

The present embodiment further provides a display panel. The display panel comprises a GOA circuit configured to drive the display panel to operate. For the GOA circuit, please refer to FIG. 2 to FIG. 5 and the above description, which will not be repeated herein. The first node Q(N), the second node P(N), and the third node Qa(N) can normally output during the suspension stage by disposing the voltage stabilizer module 500 having the voltage stabilization function to disconnect the first node Q(N) and the third node Qa(N) when the second node P(N) is at the second potential and to connect the first node Q(N) and the third node Qa(N) to become the second potential when the second node P(N) is at the third potential, wherein the second potential is opposite to the third potential, the leakage issue of the GOA circuit existing in the TP suspension stage can be improved.

The GOA circuit and the display panel provided by the present embodiment are described above in detail. Specific exemplary embodiments are used to explain the principle and implementation of the present application in the disclosure. However, the above embodiments are intended merely to assist in understanding the present application. It can be understood that those having ordinary skills of the art may easily contemplate various changes and modifications of the technical solution and technical ideas of the present application. In summary, the contents in the specification should not be considered as a limitation of the present application.

What is claimed is:

1. A gate driver on array (GOA) circuit, comprising a plurality of GOA units connected in cascade, wherein N is a positive integer and a Nth GOA unit, except for the first, the second, the second to last, and the last GOA units, comprises:
   a forward/backward scanning control module, receiving a forward scan signal and a backward scan signal, electrically connected to an output terminal of the (N−2)th GOA unit, an output terminal of the (N+2)th GOA unit, and a first node, and configured to regulate the potential at the first node to a first potential according to the potential at the output terminal of the (N−2)th GOA unit, the potential at the output terminal of the (N+2) the GOA unit, the forward scan signal, and the backward scan signal;
   an output module, comprising a ninth thin-film transistor, wherein the ninth thin-film transistor has a gate electrode electrically connected to a third node, a source electrode electrically receiving a Nth clock signal, and a drain electrode electrically connected to an output terminal;
   a potential regulation module, receiving a (N+2)th clock signal, a (N−2)th clock signal, the forward scan signal, the backward scan signal, a constant high voltage potential, and a constant low voltage potential, electrically connected to the first node and the output terminal, and configured to regulate the potential at the first node to a constant voltage potential based on the control of the (N+2)th clock signal, the (N−2)th clock signal, the forward scan signal, and the backward scan signal;
   a node control module, receiving the constant voltage potential and electrically connected to the first node and a second node;
   a voltage stabilizer module, receiving the signals from the first node, the third node, and the second node and configured to prevent the first node and the third node from conduction when the second node is at a second potential and to conduct the first node and the third node to become the second potential when the second node is at a third potential, wherein the second potential is opposite to the third potential.

2. The GOA circuit as claimed in claim 1, wherein the forward/backward scanning control module is configured to pull the potential at the first node up to the first potential according to the potential at the output terminal of the (N−2)th GOA unit, the potential at the output terminal of the (N+2)th GOA unit, the forward scan signal, and the backward scan signal;
   the potential regulation module is configured to pull the potential at the first node down to the constant low voltage potential based on the control of the (N+2)th clock signal, the (N−2)th clock signal, the forward scan signal, and the backward scan signal;
   the node control module receives the constant low voltage potential; and
   the voltage stabilizer module is configured to prevent the first node and the third node from conduction when the second node is at a low potential and to conduct the first node and the third node to become the low potential when the second node is at a high potential.

3. The GOA circuit as claimed in claim 2, wherein the voltage stabilizer module comprises a seventh thin-film transistor and an eleventh thin-film transistor, the seventh thin-film transistor has a source electrode electrically connected to the first node, a gate electrode connected to the first node, and a drain electrode connected to the third node; the eleventh thin-film transistor has a source electrode electrically connected to the third node, a gate electrode connected to the second node, and a drain electrode connected to the first node.

4. The GOA circuit as claimed in claim 3, wherein the seventh thin-film transistor and the eleventh thin-film transistor are turned off when the GOA circuit enters a scanning suspended stage during a display period, and the third node remains at the original high potential when the potential at the first node decreases.

5. The GOA circuit as claimed in claim 2, wherein the forward/backward scan control module comprises a first thin-film transistor and a second thin-film transistor, the first thin-film transistor has a gate electrode electrically connected to the output terminal of the (N−2)th GOA unit, a source electrode receiving the forward scan signal, and a drain electrode electrically connected to the first node; and the second thin-film transistor has a gate electrode electrically connected to the output terminal of the (N+2)th GOA unit, a source electrode receiving the backward scan signal, and a drain electrode electrically connected to the first node.

6. The GOA circuit as claimed in claim 5, wherein during the turn-on period of the first thin-film transistor, the third node and the forward scan signal are connected to each other and at the high potential when the potential at the first node decreases.

7. The GOA circuit as claimed in claim 6, wherein the potential regulation module comprises a third thin-film transistor, a fourth thin-film transistor, an eighth thin-film transistor, a fifth thin-film transistor, and a tenth thin-film transistor; the third thin-film transistor has a gate electrode receiving the forward scan signal, a source electrode receiving the (N+2)th clock signal, and a drain electrode electrically connected to a drain electrode of the fourth thin-film transistor; the fourth thin-film transistor has a gate electrode receiving the backward scan signal and a source electrode receiving the (N−2)th clock signal; the eighth thin-film transistor has a gate electrode electrically connected to the drain electrode of the third thin-film transistor, a source electrode receiving the constant high voltage potential, a drain electrode electrically connected to the second node; the fifth thin-film transistor has a gate electrode electrically connected to the second node, a source electrode electrically connected to the first node, and a drain electrode receiving the constant low voltage potential; and the tenth thin-film transistor has a gate electrode electrically connected to the second node, a source electrode electrically connected to the output terminal, and a drain electrode receiving the constant low voltage potential.

8. The GOA circuit as claimed in claim 7, wherein the node control module comprises a sixth thin-film transistor, the sixth thin-film transistor has a gate electrode electrically connected to the first node, a source electrode electrically connected to the second node, and a drain electrode receiving the constant low voltage potential.

9. The GOA circuit as claimed in claim 1, wherein the GOA circuit further comprises:
   a first capacitor, having one end receiving the constant low voltage potential and the other end electrically connected to the first node; and/or
   a second capacitor, having one end electrically connected to the second node and the other end receiving the constant low voltage potential.

10. The GOA circuit as claimed in claim 8, wherein when the GOA circuit operates at a scanning stage during a display period, the GOA circuit is configured to:
   when the potential at the output terminal of the (N−2)th GOA unit is at the high potential, turn on the first thin-film transistor to convert the potential at the first node and the third node into the high potential and turn on the ninth thin-film transistor to electrically connect the output terminal to the Nth clock signal, wherein the output terminal outputs the high potential if the Nth clock signal is the high potential;
   if the (N+2)th clock signal is the high potential and causes a fourth node is at the high potential, turn on the eighth thin-film transistor to convert the potential at the second node into the high potential, turn on the fifth thin-film transistor to convert the potential at the first node into the low potential, turn on the eleventh thin-film transistor to conduct the first node and the third node and to convert the potential at the third node into the low potential, turn off the ninth thin-film transistor, and turn on the tenth thin-film transistor to electrically connect the output terminal and the constant low voltage potential.

11. The liquid GOA circuit as claimed in claim 1, wherein the forward/backward scan control module is configured to pull the potential at the first node down to the first potential according to the potential at the output terminal of the (N−2)th GOA unit, the potential at the output terminal of the (N+2)th GOA unit, the forward scan signal, and the backward scan signal;
   the potential regulation module is configured to pull the potential at the first node up to the constant high voltage potential based on the control of the (N+2)th clock signal, the (N−2)th clock signal, the forward scan signal, and the backward scan signal;
   the node control module receives the constant high voltage potential; and
   the voltage stabilizer module is configured to prevent the first node and the third node from conduction when the second node is at a high potential and to conduct the first node and the third node to become the high potential when the second node is at a low potential.

12. A gate driver on array (GOA) circuit, comprising a plurality of GOA units connected in cascade, wherein N is a positive integer and a Nth GOA unit, except for the first, the second, the second to last, and the last GOA units, comprises:
   a ninth thin-film transistor, having a gate electrode electrically connected to a third node, a source electrode electrically receiving a Nth clock signal, and a drain electrode electrically connected to an output terminal;
   a seventh thin-film transistor, having a source electrode electrically connected to a first node, a gate electrode connected to the first node, and a drain electrode connected to the third node;
   an eleventh thin-film transistor, having a source electrode electrically connected to the third node, a gate electrode connected to a second node, and a drain electrode connected to the first node;
   when the GOA circuit enters a suspended period during display, the seventh thin-film transistor and the eleventh thin-film transistor are turned off, the potential at the first node decreases, and the third node remains at the original high potential.

13. The GOA circuit as claimed in claim 12, further comprising:
   a first thin-film transistor, having a gate electrode electrically connected to the output terminal of the (N−2)th GOA unit, a source electrode receiving a forward scan signal, and a drain electrode electrically connected to the first node;
   a second thin-film transistor, having a gate electrode electrically connected to the output terminal of the (N+2)th GOA unit, a source electrode receiving a backward scan signal, and a drain electrode electrically connected to the first node.

14. The GOA circuit as claimed in claim 13, wherein during a turn-on stage of the first thin-film transistor, the third node and the forward scan signal are connected to each other and at the high potential when the potential at the first node decreases.

15. The GOA circuit as claimed in claim 14, further comprising:
   a third thin-film transistor, having a gate electrode receiving the forward scan signal and a source electrode receiving the (N+2)th clock signal;
   a fourth thin-film transistor, having a gate electrode receiving the backward scan signal, a source electrode receiving the (N−2)th clock signal, and a drain electrode electrically connected to a drain electrode of the third thin-film transistor;
   an eighth thin-film transistor, having a gate electrode electrically connected to the drain electrode of the third thin-film transistor, a source electrode receiving a constant high voltage potential, a drain electrode electrically connected to the second node;
   a fifth thin-film transistor, having a gate electrode electrically connected to the second node, a source electrode electrically connected to the first node, and a drain electrode receiving a constant low voltage potential; and
   a tenth thin-film transistor, having a gate electrode electrically connected to the second node, a source electrode electrically connected to the output terminal, and a drain electrode receiving the constant low voltage potential.

16. The GOA circuit as claimed in claim 15, wherein the GOA circuit further comprises a sixth thin-film transistor, having a gate electrode electrically connected to the first node, a source electrode electrically connected to the second node, and a drain electrode receiving the constant low voltage potential.

17. The GOA circuit as claimed in claim 12, further comprising:
   a first capacitor, having one end receiving the constant low voltage potential and the other end electrically connected to the first node; and/or
   a second capacitor, having one end electrically connected to the second node and the other end receiving the constant low voltage potential.

18. The GOA circuit as claimed in claim 16, wherein when the GOA circuit operates at a scanning stage during a display period, the GOA circuit is configured to:
   when the potential at the output terminal of the (N−2)th GOA unit is at the high potential, turn on the first thin-film transistor to convert the potential at the first node and the third node into the high potential and turn on the ninth thin-film transistor to electrically connect the output terminal to the Nth clock signal, wherein the output terminal outputs the high potential if the Nth clock signal is the high potential;
   if the (N+2)th clock signal is the high potential and causes a fourth node is at the high potential, turn on the eighth thin-film transistor to convert the potential at the second node into the high potential, turn on the fifth thin-film transistor to convert the potential at the first node into the low potential, turn on the eleventh thin-film transistor to conduct the first node and the third node and to convert the potential at the third node into the low potential, turn off the ninth thin-film transistor, and turn on the tenth thin-film transistor to electrically connect the output terminal and the constant low voltage potential.

19. A display panel, comprising a gate driver on array (GOA) circuit, wherein the GOA circuit comprises a plurality of GOA units connected in cascade, N is a positive integer and a Nth GOA unit, except for the first, the second, the second to last, and the last GOA units, comprises:
   a forward/backward scanning control module, receiving a forward scan signal and a backward scan signal, electrically connected to an output terminal of the (N−2)th GOA unit, an output terminal of the (N+2)th GOA unit, and a first node, and configured to regulate the potential at the first node to a first potential according to the potential at the output terminal of the (N−2)th GOA unit, the potential at the output terminal of the (N+2) the GOA unit, the forward scan signal, and the backward scan signal;
   an output module, comprising a ninth thin-film transistor, wherein the ninth thin-film transistor has a gate electrode electrically connected to a third node, a source electrode electrically receiving a Nth clock signal, and a drain electrode electrically connected to an output terminal;
   a potential regulation module, receiving a (N+2)th clock signal, a (N−2)th clock signal, the forward scan signal, the backward scan signal, a constant high voltage potential, and a constant low voltage potential, electrically connected to the first node and the output terminal, and configured to regulate the potential at the first node to a constant voltage potential based on the control of the (N+2)th clock signal, the (N−2)th clock signal, the forward scan signal, and the backward scan signal;
   a node control module, receiving the constant voltage potential and electrically connected to the first node and a second node; and
   a voltage stabilizer module, receiving the signals from the first node, the third node, and the second node and configured to prevent the first node and the third node from conduction when the second node is at a second potential and to conduct the first node and the third node to become the second potential when the second node is at a third potential, wherein the second potential is opposite to the third potential.

20. The display panel as claimed in claim 19, wherein the forward/backward scanning control module is configured to pull the potential at the first node up to the first potential according to the potential at the output terminal of the (N−2)th GOA unit, the potential at the output terminal of the (N+2)th GOA unit, the forward scan signal, and the backward scan signal;
   the potential regulation module is configured to pull the potential at the first node down to the constant low voltage potential based on the control of the (N+2)th clock signal, the (N−2)th clock signal, the forward scan signal, and the backward scan signal;
   the node control module receives the constant low voltage potential; and
   the voltage stabilizer module is configured to prevent the first node and the third node from conduction when the second node is at a low potential and to conduct the first node and the third node to become the low potential when the second node is at a high potential.

* * * * *